United States Patent
Rozsa et al.

(10) Patent No.: US 10,018,889 B2
(45) Date of Patent: Jul. 10, 2018

(54) ACOUSTO-OPTIC DEFLECTOR COMPRISING MULTIPLE ELECTRO-ACOUSTIC TRANSDUCERS

(71) Applicant: Femtonics Kft., Budapest (HU)

(72) Inventors: Balazs Jozsef Rozsa, Budapest (HU); Gergely Katona, Budapest (HU); Pal Andor Maak, Budapest (HU)

(73) Assignee: Femtonics Kft., Budapest (HU)

( * ) Notice: Subject to any disclaimer, the term of this patent is extended or adjusted under 35 U.S.C. 154(b) by 0 days.

(21) Appl. No.: 15/039,598

(22) PCT Filed: Nov. 28, 2013

(86) PCT No.: PCT/HU2013/000115
§ 371 (c)(1),
(2) Date: May 26, 2016

(87) PCT Pub. No.: WO2015/079269
PCT Pub. Date: Jun. 4, 2015

(65) Prior Publication Data
US 2017/0212406 A1  Jul. 27, 2017

(51) Int. Cl.
| | | |
|---|---|---|
| G02F 1/33 | (2006.01) |
| G02F 1/335 | (2006.01) |
| H03H 9/00 | (2006.01) |
| G02F 1/11 | (2006.01) |
| H03H 9/64 | (2006.01) |
| H03H 9/02 | (2006.01) |

(52) U.S. Cl.
CPC ............. *G02F 1/332* (2013.01); *G02F 1/113* (2013.01); *G02F 1/33* (2013.01); *G02F 1/335* (2013.01); *H03H 9/00* (2013.01); *H03H 9/64* (2013.01); *G02F 1/11* (2013.01); *G02F 2203/07* (2013.01); *H03H 9/02535* (2013.01); *H03H 9/02574* (2013.01)

(58) Field of Classification Search
CPC ... G02F 1/11; G02F 1/113; G02F 1/33; G02F 1/332; G02F 1/335; G02F 1/116; G02F 2203/07; H01S 3/117; G02B 6/2861; G02B 6/12004; H03H 9/00; H03H 9/0222; H03H 9/02535; H03H 9/02574; H03H 9/38; H03H 9/64; B41J 2/14008; H01L 27/20; H04R 23/00; H04R 23/02
USPC ........ 359/285, 305, 310, 311, 313; 333/144, 333/147, 149, 193, 195; 372/13, 32; 385/7, 16; 345/176, 177
See application file for complete search history.

(56) References Cited

U.S. PATENT DOCUMENTS

| | | | | |
|---|---|---|---|---|
| 3,609,009 A | * | 9/1971 | Lohman | G02F 1/332 359/310 |
| 4,084,182 A | * | 4/1978 | Maiman | H04N 9/3129 348/760 |
| 4,348,075 A | * | 9/1982 | Gottlieb | G02F 1/335 385/7 |
| 4,371,964 A | * | 2/1983 | Podmaniczky | G02F 1/113 359/311 |

(Continued)

*Primary Examiner* — Loha Ben
(74) *Attorney, Agent, or Firm* — Olson & Cepuritis, Ltd.

(57) ABSTRACT

The invention relates to an acousto-optic deflector comprising a bulk of acousto-optic medium and acoustic wave generator coupled to the bulk, characterized by that the acoustic wave generator comprises at least two different electro-acoustic transducers for generating acoustic waves in the bulk.

7 Claims, 1 Drawing Sheet

(56) References Cited

U.S. PATENT DOCUMENTS

| | | | | | |
|---|---|---|---|---|---|
| 4,395,702 | A | * | 7/1983 | Gottlieb | G02B 6/12004 |
| | | | | | 341/111 |
| 4,491,384 | A | * | 1/1985 | Yamashita | G02F 1/335 |
| | | | | | 385/16 |
| 4,549,789 | A | * | 10/1985 | Horiuchi | G02F 1/332 |
| | | | | | 359/311 |
| 4,604,543 | A | * | 8/1986 | Umemura | B06B 1/0622 |
| | | | | | 310/334 |
| 4,620,167 | A | * | 10/1986 | Brooks | G01R 23/17 |
| | | | | | 310/313 D |
| 5,121,245 | A | * | 6/1992 | Johnson | H01S 3/117 |
| | | | | | 359/285 |
| 5,122,766 | A | * | 6/1992 | Huignard | H03H 9/38 |
| | | | | | 333/144 |
| 5,161,206 | A | * | 11/1992 | Djupsjobacka | G02F 1/0327 |
| | | | | | 385/2 |
| 5,197,074 | A | * | 3/1993 | Emmons, Jr. | H01S 3/136 |
| | | | | | 372/10 |
| 5,351,219 | A | * | 9/1994 | Adachi | H04R 23/006 |
| | | | | | 310/335 |
| 6,036,301 | A | * | 3/2000 | Amemiya | B41J 2/14 |
| | | | | | 347/46 |
| 7,207,651 | B2 | * | 4/2007 | Amemiya | B41J 2/02 |
| | | | | | 347/46 |
| 7,405,512 | B2 | * | 7/2008 | Pannell | G02F 1/116 |
| | | | | | 257/E27.006 |

\* cited by examiner

ACOUSTO-OPTIC DEFLECTOR COMPRISING MULTIPLE ELECTRO-ACOUSTIC TRANSDUCERS

CROSS-REFERENCE TO RELATED APPLICATION

This application is a U.S. National Phase of PCT/HU2013/000115, filed Nov. 28, 2013, which is incorporated herein by reference.

The present invention relates to an acousto-optic deflector comprising a bulk of acousto-optic medium and acoustic wave generator coupled to the bulk.

Three-dimensional (3D) laser scanning technologies have great importance in performing measurements on biological specimens (including scanning, imaging, detection, excitation, etc.).

State of the art technologies commonly apply two-photon laser scanning microscopes that use a laser light of lower photon energy of which two photons are needed to excite a fluorophore in a quantum event, resulting in the emission of a fluorescence photon, which is then detected by a detector. The probability of a near simultaneous absorption of two photons is extremely low requiring a high flux of excitation photons, thus two-photon excitation practically only occurs in the focal spot of the laser beam, where the beam intensity overcomes the two-photon threshold. The photon number is increased also by mode-locking the excitation laser causing photons to arrive in high intensity bounces at the sample. Generally a femtosecond pulsed laser is used to provide the required photon flux for the two-photon excitation, while keeping the average laser beam intensity sufficiently low to avoid thermal sample deterioration.

In the case of analysing biological specimens, it is generally preferred to move the focus spot of the laser beam instead of moving the specimen, which would be difficult to carry out when using submerge specimen chambers or when electrical recording is performed on the biological specimen with microelectrodes. Moving the focus spot along an arbitrary trajectory can be achieved by deflecting the laser beam to scan different points in a focal plane (plane X-Y) and by displacing the objective along its optical axis (axis Z) e.g. via a piezo-positioner in order to change the depth of the focal plane.

XY scanning is conventionally achieved by deflecting the laser beam within a given focal plane plane X-Y) via mechano-optical deflecting means such as deflecting mirrors mounted on galvanometric scanners. However, the inertia of the mechanical scanning components (i.e. the scanning mirrors and the microscope objective) presents certain limitations with regard to the achievable scanning speed, since the scanning components need to be physically displaced in order to perform 3D scanning.

Rapid acousto-optic deflectors have been proposed as an alternative to the conventional mechano-optic solutions. Such deflectors comprise a bulk made of an acousto-optic medium and an acoustic wave generating electro-acoustic transducer coupled therewith. The acousto-optic medium of the bulk is a crystal, and as acoustic waves are propagated through the bulk, the crystal lattice constants of the crystal are slightly modified by the acoustic waves, whereby the bulk acts as an optical grating of modifiable grating constant.

Kaplan et al. ("Acousto-optic lens with very fast focus scanning", OPTICS LETTERS/Vol. 26, No. 14/July 15, (2001)) proposed an acousto-optic lens made up of two deflectors with counter propagating acoustic waves locked in phase, to achieve purely focal plane shift along the Z axis without lateral moving of the beam. In this type of application, chirped frequency acoustic waves should be generated, i.e. the frequency of the acoustic wave in the acousto-optic medium of the deflectors is continuously changed. Changing the focus of the acousto-optic lens is achieved by changing the sweep rate of the acoustic frequencies through the optical aperture of the acousto-optic devices. To simultaneously move the beam and change the focal plane, the sweep rates have to be changed and acoustic frequency difference between the two deflectors of a pair should be introduced. To displace the focal spot along the axis X, acoustic frequency difference between the deflectors deflecting in the plane X-Z should be applied, and for displacement along the axis Y acoustic frequency difference should be applied between the deflectors of the pair deflecting in the plane Y-Z. The amount of the frequency difference in the respective pairs determines the X and Y coordinates of the spot.

FIG. 1 shows the theoretical diffraction efficiency curve of a prior art acousto-optic deflector, as a function of frequency for different optical wavelengths achievable with an ideal transducer. The curves were calculated with the same crystallographic orientation of the bulk for both acoustic and optical waves in $TeO_2$, assuming the same acoustic power. It is obvious that the deflector will diffract efficiently at lower acoustic frequencies when the optical wavelength is increased, and that maximum output optical power and acoustic frequency bandwidth are both decreased.

The prior art electro-acoustic transducers are only capable of generating acoustic waves within a limited acoustic frequency working range of about one octave. In order to deflect a laser beam of a given central optical wavelength propagating through the bulk of the acousto-optic deflector within a desired field of view, a given range of acoustic frequencies are required; however, laser beams of different central optical wavelengths require different ranges of acoustic frequencies for achieving the same field of view as shown in FIG. 1. Accordingly, in the prior art acousto-optic deflectors, the transducer is chosen to have an acoustic frequency working range that corresponds to what is required for deflecting a laser beam of a given central optical wavelength, meaning that the acoustic frequency working range of the transducer is optimised for the central optical wavelength of the laser source that is to be used with the acousto-optic deflector.

However, in case of certain measurements, the sample is preferably excited by laser beams of different central optical wavelengths that are preferably provided by more than one laser or a single tuneable laser. For example, to effectively excite different type of biomarkers, such as genetically encoded calcium indicators (e.g. GCaMP3, GCaMP5) and different AM dyes (e.g. OGB-1 AM), the acousto-optic deflector should ideally operate at different central optical wavelengths (e.g. at 810 nm for OGB-1, at 950 nm for GCaMP3 and at ~740 nm for two-photon uncaging). The change in optical wavelength imposes a change in the acoustic frequency range in the deflector. However, prior art transducers have a limited acoustic frequency working range, and are not optimally suited for diffracting laser beams of arbitrary central optical wavelength passing through the deflector. If the different central optical wavelengths are not too far from each other, then an acousto-optic deflector having a transducer optimised for one such central optical wavelength will deflect the other wavelength laser beams as well, but within a reduced frequency range. As an alternative solution, an acousto-optic deflector optimised for a first central optical wavelength is replaced by deflector optimised for a second central optical wavelength when wishing to perform a measurement at the second central optical wavelength. This, however, is time consuming, cumbersome and expensive (since at least a second acousto-optic deflector is required).

It is an object of the present invention to overcome the problems associated with the prior art. In particular, it is an object of the invention to provide an acousto-optic deflector having at least two acoustic frequency working ranges.

The above objects are achieved by an acousto-optic deflector according to the appended claims.

Further details of the invention will be apparent from the accompanying figures and exemplary embodiments.

DETAILED DESCRIPTION OF THE PREFERRED EMBODIMENT

Figure 1:
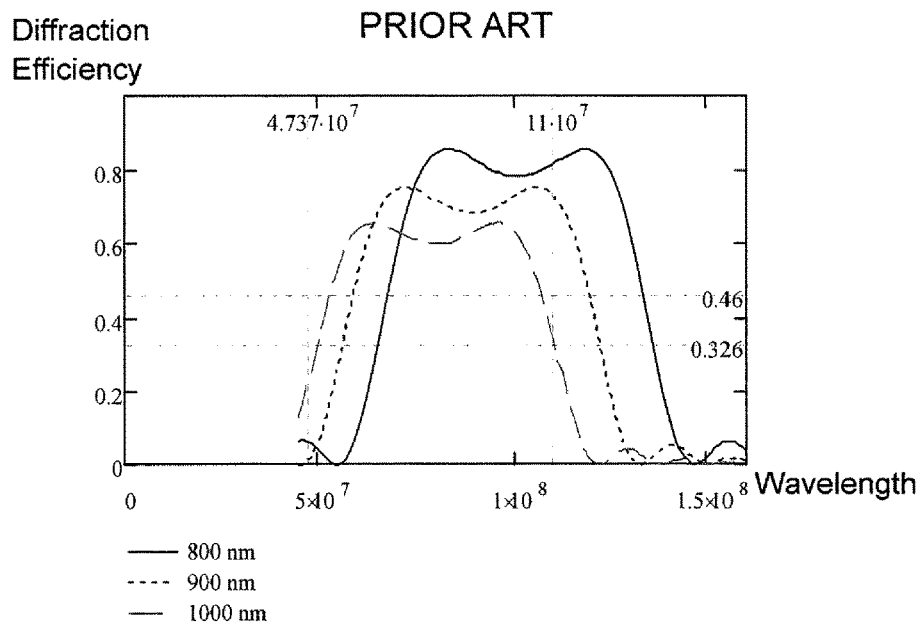
FIG. 1 is the theoretical diffraction efficiency curve of a prior art acousto-optic deflector, as a function of frequency for different optical wavelengths.
Figure 2:
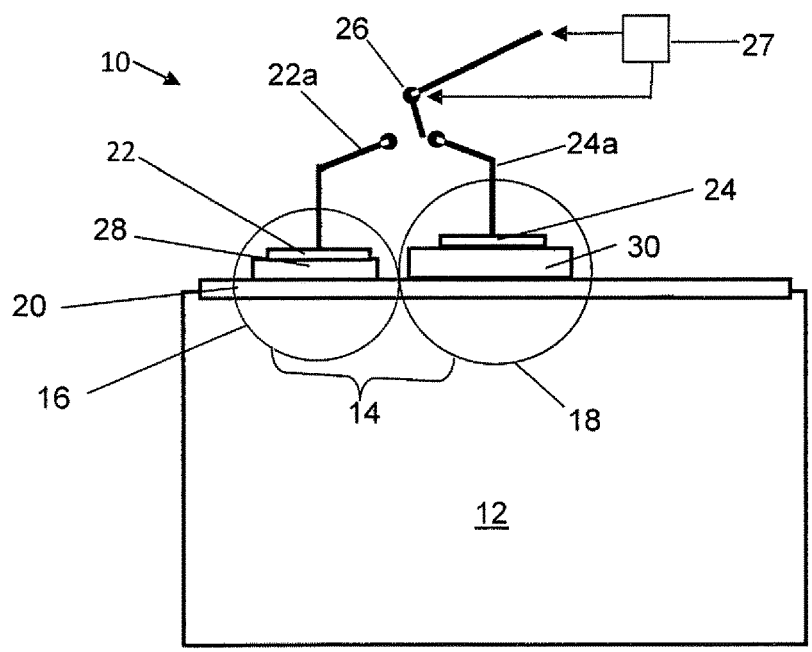
FIG. 2 is a schematic cross sectional view of a preferred embodiment of an acousto-optic deflector according to the invention.

FIG. 2 schematically illustrates a preferred embodiment of an acousto-optic deflector 10 in accordance with the present invention. The deflector 10 comprises a bulk 12 of acousto-optic medium and an acoustic wave generator 14 coupled to the bulk 12. According to the depicted embodiment the acoustic wave generator 14 comprises two different, a first and a second electro-acoustic transducer 16, 18 for generating acoustic waves in the bulk 12 in order to deflect a laser beam propagating through the bulk 12. The first and the second transducers 16, 18 are different in that they work in different acoustic frequency ranges (i.e. they have different acoustic frequency working ranges) and/or they generate acoustic waves of different acoustic polarisation mode, whereby the acousto-optic deflector 10 is optimised for laser beams of different central optical wavelength and/or of different polarisation when operating with the first or the second transducer 16, 18. It should be appreciated that the acoustic wave generator 14 may comprise more than two transducers 16, 18, in which case, each transducer 16, 18 may have a different acoustic frequency working range and/or different acoustic polarisation mode.

The possibility to generate different acoustic modes propagating in the same direction has also its practical importance, since modes with different polarization propagate with different velocity thus allowing scanning with different speeds over different angle ranges. In a typical arrangement the slowest acoustic mode provides the highest scanning angle range and highest optical throughput, whereas the faster modes provide 5-10 times faster scanning over a limited scanning range. Both functions can be useful during imaging most preferably the slow scanning providing larger image and during functional measurement the faster scanning capable to capture dynamic biological processes.

The two transducers 16, 18 preferably comprise a common first electrode 20 (as shown in FIG. 2), which is coupled to the bulk 12. This renders the manufacture of the acoustic wave generator 14 more simple and economic; however, the transducers 16, 18 may have separate first electrodes 20 that are coupled to the bulk 12, moreover such transducers 16, 18 may be coupled to different sides of the bulk 12.

The two transducers 16, 18 further comprise separate second electrodes 22, 24 preferably being provided with contact means 22a, 24a that are connectable to an electric driving signal source over an electric switch 26. The electric signal source is preferably a control system 27 providing the drive signals for the acoustic wave generator 14 and the electric switch 26 as well. The electric switch 26 may be a fast radio-frequency switch, preferably having a switching time of less than 50 nsec, more preferably of less than 10 nsec.

Each transducer 16, 18 further comprises a piezoelectric plate 28, 30 interposed between the common (or separate) first electrode 20 and the second electrodes 22, 24. The transducers 16, 18 may comprise further layers such as acoustic matching layers and/or bonding layers (not shown). The piezoelectric plates 28, 30 are preferably made of piezoelectric crystals that transform electric signals into acoustic waves by changing their static dimension in response to an external electric field.

The different acoustic frequency working range of the transducers 16, 18 may be achieved by providing transducers 16, 18 of different thickness, e.g. the piezoelectric plates 28, 30 and/or the acoustic matching layers may have different thicknesses. Alternatively, if the first and second transducers 16, 18 differ in acoustic polarisation mode this may be achieved by providing piezoelectric plates 28, 30 of different crystal orientation.

Various modifications to the above disclosed embodiments will be apparent to a person skilled in the art without departing from the scope of protection determined by the attached claims.

The invention claimed is:

1. Acousto-optic deflector comprising a bulk of acousto-optic medium and an acoustic wave generator coupled to the bulk, the acoustic wave generator comprising at least two different electro-acoustic transducers for generating acoustic waves in the bulk, each transducer comprising a first electrode coupled to the bulk, a second electrode, and a piezoelectric plate interposed between the first and second electrodes, the at least two transducers comprising different piezoelectric plates, which differ in thickness and/or crystal orientation characterised by that the second electrodes have contact means that are connectable to an electric driving signal source over an electric switch.

2. Acousto-optic deflector according to claim 1, characterised by that the first electrodes of at least two of the transducers are a common electrode.

3. Acousto-optic deflector according to claim 1, characterised by that the electric switch is a radio-frequency switch, preferably having a switching time of less than 10 nsec.

4. Acousto-optic deflector according to claim 1, characterised by that the acoustic wave generator comprises at least:
   a first transducer having a first acoustic frequency working range, and
   a second transducer having a second acoustic frequency working range.

5. Acousto-optic deflector according to claim 4, characterised by that the first transducer's acoustic frequency working range is optimised for laser beams of a first range of central optical wavelengths to be deflected when passing through the bulk, and the second transducer's acoustic frequency working range is optimised for laser beams of a second range of central optical wavelengths to be deflected when passing through the bulk.

6. Acousto-optic deflector according to claim 1, characterised by that the acoustic wave generator comprises at least:
- a first transducer generating a first acoustic polarisation mode, and
- a second transducer generating a second acoustic polarisation mode.

7. Acousto-optic deflector according to claim 1, characterised by that the at least two transducers are mounted on the same side of the bulk.

* * * * *